United States Patent [19]

Nguyen

[11] Patent Number: 5,471,253
[45] Date of Patent: Nov. 28, 1995

[54] VIDEO/AUDIO ELECTRONIC DEVICE CONTROL SIGNAL SOURCE SELECTION SWITCH

[76] Inventor: Dien V. Nguyen, 2708 W. 144th St., Gardena, Calif. 90249

[21] Appl. No.: 218,418

[22] Filed: Mar. 28, 1994

[51] Int. Cl.$^6$ ................................................. H04N 5/44
[52] U.S. Cl. ........................................... 348/734; 348/725
[58] Field of Search .................................. 348/734, 725, 348/825, 836; 358/194.1; 307/139, 140, 142; H04N 5/64, 5/44

[56] References Cited

U.S. PATENT DOCUMENTS

| | | | |
|---|---|---|---|
| 4,633,514 | 12/1986 | Fimoff et al. | 348/734 |
| 4,837,627 | 6/1989 | Mengel | 348/734 |
| 5,097,260 | 3/1992 | Ahn | 348/734 |
| 5,231,310 | 7/1993 | Oh | 348/725 |

FOREIGN PATENT DOCUMENTS 96775  7/1980  Japan .

*Primary Examiner*—James J. Groody
*Assistant Examiner*—Chris Grant

[57] ABSTRACT

A video/audio electronic device control signal source selection switch for allowing a user to select the source of signals for controlling the operation of an video/audio electronic device comprising a switch having three orientations for enabling a normal, local, and remote mode of operation; an input terminal adapted to receive both internal panel control and remote control signals; and an output terminal for transmitting selected remote and panel control signals, with the normal mode allowing the transmission of both selected remote and panel control signals, whereby permitting the user to control the operation of the electronic device using both the remote control and the panel controls, the local mode allowing transmission of only selected panel control signals, whereby permitting the user to control the operation of the electronic device with only the panel controls, and the remote mode allowing the transmission of only selected remote control signals, whereby permitting the user to control the operation of the electronic device with only the remote control; and a transmission mechanism for delivering internal remote and panel control signals from the electronic device to the switch and supplying selected remote and panel control signals from the switch back to the video/audio electronic device for controlling its operation.

6 Claims, 3 Drawing Sheets

5,471,253

VIDEO/AUDIO ELECTRONIC DEVICE CONTROL SIGNAL SOURCE SELECTION SWITCH

BACKGROUND OF THE INVENTION

1. Field of the Invention

The present invention relates to a video/audio electronic device control signal source selection switch and more particularly pertains to allowing an user to select the source of signals for controlling the operation of video/audio electronic devices such as televisions, video cassette recorders, and the like with a video/audio electronic device control signal source selection switch.

2. Description of the Prior Art

The use of switch mechanisms is known in the prior art. More specifically, switch mechanisms heretofore devised and utilized for the purpose of controlling the operation of video/audio electronic equipment such as televisions, video cassette recorders, and the like are known to consist basically of familiar, expected and obvious structural configurations, notwithstanding the myriad of designs encompassed by the crowded prior art which have been developed for the fulfillment of countless objectives and requirements.

By way of example, U.S. Pat. No. 3,879,332 to Leone discloses a built-in television timer and locking mechanism. U.S. Pat. No. 4,032,794 to Meade discloses a television locking mechanism. U.S. Pat. No. 4,232,396 to Grimes discloses a television channel lock-out apparatus. U.S. Pat. No. 4,510,623 to Bonneau et al. discloses a television channel lockout. U.S. Pat. No. 5,231,310 to Oh discloses an electrical and electronic appliance lock.

While these devices fulfill their respective, particular objective and requirements, the aforementioned patents do not describe a video/audio electronic device control signal source selection switch that has a normal mode for allowing both the resident control panel and remote control to operate a video/audio electronic device, a local mode for allowing only the resident control panel to operate a video/audio electronic device, and a remote mode for allowing only the resident control panel to operate a video/audio electronic device.

In this respect, the video/audio electronic device control signal source selection switch according to the present invention substantially departs from the conventional concepts and designs of the prior art, and in doing so provides an apparatus primarily developed for the purpose of allowing an user to select the source of signals for controlling the operation of video/audio electronic devices such as televisions, video cassette recorders, and the like.

Therefore, it can be appreciated that there exists a continuing need for new and improved video/audio electronic device control signal source selection switch which can be used for allowing an user to select the source of signals for controlling the operation of video/audio electronic devices such as televisions, video cassette recorders, and the like. In this regard, the present invention substantially fulfills this need.

SUMMARY OF THE INVENTION

In the view of the foregoing disadvantages inherent in the known types of switch mechanisms now present in the prior art, the present invention provides an improved video/audio electronic device control signal source selection switch. As such, the general purpose of the present invention, which will be described subsequently in greater detail, is to provide a new and improved video/audio electronic device control signal source selection switch and method which has all the advantages of the prior art and none of the disadvantages.

To attain this, the present invention essentially comprises a hollow box-shaped container having opposed and spaced top and bottom walls with a peripheral side edge disposed therearound. Four suction cup feet are included with each foot coupled to the bottom wall of the container near a corner thereof and extended downwards therefrom, the feet adapted to be coupled to the outer surface of the video/audio electronic device. A switch is coupled to the container with the switch having three orientations for enabling a normal mode of operation, a local mode of operation, and a remote mode of operation thereof. The switch includes an input terminal adapted to receive both internal panel control signals that are generated through user interaction with the panel controls and internal remote control signals that are generated through user interaction with the remote control mechanism. The switch includes an output terminal for transmitting selected remote control signals and selected panel control signals in a mode of operation based on the orientation thereof, with the normal mode of operation allowing the transmission of both selected remote control signals and selected panel control signals, whereby permitting the user to control the operation of the electronic device using both the remote control and the panel controls, the local mode of operation allowing transmission of only selected panel control signals, whereby permitting the user to control the operation of the electronic device with the panel controls but preventing the user from controlling the operation of the electronic device with the remote control, and the remote mode of operation allowing the transmission of only selected remote control signals, whereby permitting the user to control the operation of the electronic device with the remote control but preventing the user from controlling the operation of the electronic device with the panel controls. Transmission means are included and are adapted to be coupled between the electronic device and the switch for delivering internal remote control signals and internal panel control signals from the electronic device to the switch and supplying selected remote control signals and selected panel control signals from the switch back to the electronic device for controlling its operation.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved video/audio electronic device control signal source selection switch which has all the advantages of the prior art switch mechanisms and none of the disadvantages.

It is another object of the present invention to provide a new and improved video/audio electronic device control signal source selection switch which may be easily and efficiently manufactured and marketed.

It is a further object of the present invention to provide a new and improved video/audio electronic device control signal source selection switch which is of durable and reliable construction.

An even further object of the present invention is to provide a new and improved video/audio electronic device control signal source selection switch which is susceptible of a low cost of manufacture with regard to both materials and labor, and which accordingly is then susceptible of low prices of sale to the consuming public, thereby making such a video/audio electronic device control signal source selection switch economically available to the buying public.

Still yet another object of the present invention is to provide a new and improved video/audio electronic device control signal source selection switch which provides in the apparatuses and methods of the prior art some of the advantages thereof, while simultaneously overcoming some of the disadvantages normally associated therewith.

Even still another object of the present invention is to provide a new and improved video/audio electronic device control signal source selection switch for allowing an user to select the source of signals for controlling the operation of video/audio electronic devices such as televisions, video cassette recorders, and the like.

Lastly, it is an object of the present invention to provide a new and improved video/audio electronic device control signal source selection switch comprising a switch having three orientations for enabling a normal mode of operation, a local mode of operation, and a remote mode of operation thereof; an input terminal adapted to receive both internal panel control signals that are generated through user interaction with the panel controls and internal remote control signals that are generated through user interaction with the remote control mechanism; and an output terminal for transmitting selected remote control signals and selected panel control signals in a mode of operation based on the orientation thereof, with the normal mode of operation allowing the transmission of both selected remote control signals and selected panel control signals, whereby permitting the user to control the operation of the electronic device using both the remote control and the panel controls, the local mode of operation allowing transmission of only selected panel control signals, whereby permitting the user to control the operation of the electronic device with the panel controls but preventing the user from controlling the operation of the electronic device with the remote control, and the remote mode of operation allowing the transmission of only selected remote control signals, whereby permitting the user to control the operation of the electronic device with the remote control but preventing the user from controlling the operation of the electronic device with the panel controls; and transmission means adapted to be coupled between the electronic device and the switch for delivering internal remote control signals and internal panel control signals from the electronic device to the switch and supplying selected remote control signals and selected panel control signals from the switch back to the electronic device for controlling its operation.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

The same reference numerals refer to the same parts through the various Figures.

DESCRIPTION OF THE PREFERRED EMBODIMENT

Figure 1:
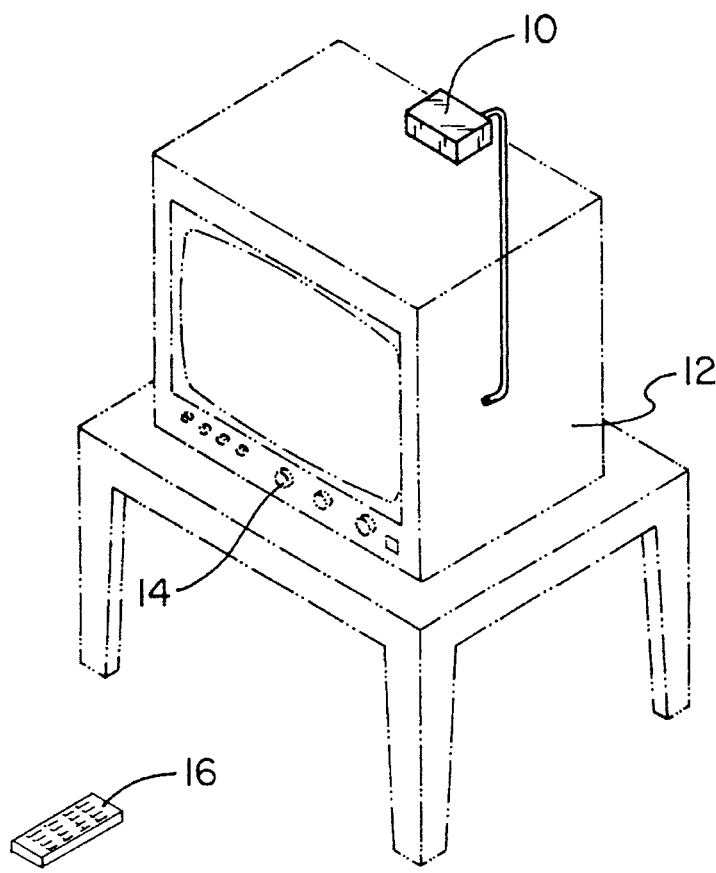
FIG. 1 is a perspective view of the preferred embodiment of the video/audio electronic device control signal source selection switch constructed in accordance with the principles of the present invention.

With reference now to the drawings, and in particular, to FIG. 1 thereof, the preferred embodiment of the new and improved video/audio electronic device control signal source selection switch embodying the principles and concepts of the present invention and generally designated by the reference number 10 will be described.

Specifically, the present invention includes 4 major components. The major components are the container, feet, switch, and transmission means. These components are interrelated to provide the intended function.

More specifically, the present invention allows a user to select the source of signals for controlling the operation of a video/audio electronic device 12. The video/audio electronic device is assumed to have resident panel controls 14 and an accompanying remote control mechanism 16. Although the remote is separate from the video/audio electronic device, in view of the present invention both the video/audio electronic device and remote are considered integral components required for the operation of the present invention.

Figure 3:
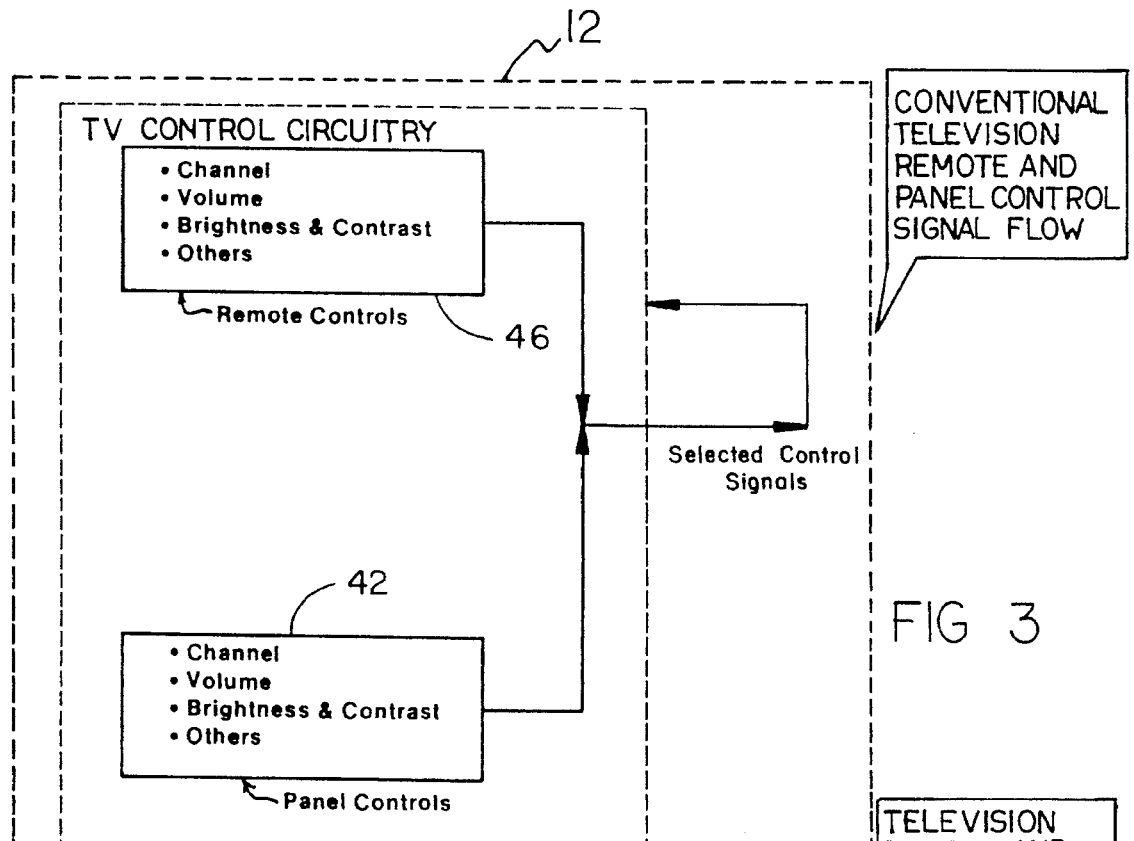
FIG. 3 is a functional block diagram of an electronic device depicting the flow of internal remote control signals and front panel control signals without the present invention installed.

It will be noted in the various Figures that the first major component is the container 18 of FIG. 3. The container is hollow and box-shaped. It has opposed and spaced top and bottom walls 20, 22. It also has a peripheral edge 24 disposed therearound.

The second major component is the feet 26. The present invention includes four feet. They are fashioned in the form of suction cups. Each foot is coupled to the bottom wall of the container near a corner thereof. Each foot extends downwards from the bottom wall and is adapted to be coupled to the outer surface of the electronic video/audio device 12.

Figure 4:
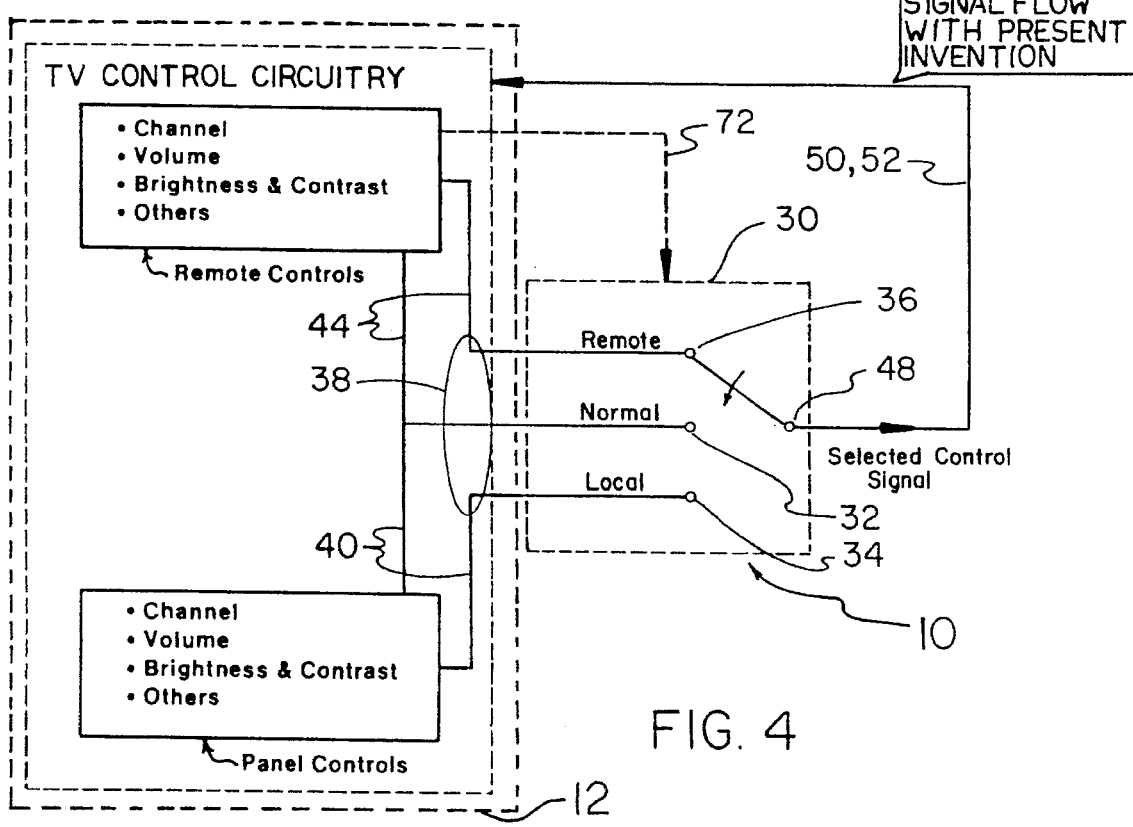
FIG. 4 is a functional block diagram of an electronic device depicting the flow of internal remote control signals and front panel control signals with the present invention installed.

The third major component is the switch 30 of FIG. 4. The switch is coupled to the container 18. The switch has three orientations. The first orientation is used for enabling a normal mode of operation 32. The second orientation is used for enabling a local mode of operation 34. The third orientation is used for enabling a remote mode of operation 36.

The switch has an input terminal 38. The input terminal is adapted to receive internal panel control signals 40. The internal panel control signals are generated through user interaction with the panel controls 14. The input terminal is also adapted to receive remote control signals 44. The remote control signals are generated through user interaction with the remote control mechanism 16.

The switch has an output terminal 48. The output terminal is used for transmitting selected remote control signals 50 and selected panel controls 52 in a mode of operation based on the orientation of the switch. The normal mode of operation allows the transmission of both selected remote control signals and selected panel control signals whereby permitting the user to control the operation of the electronic device using both the remote control 16 and the panel controls 14. The local mode of operation allows transmission of only selected panel control signals, whereby permitting the user to control the operation of the electronic device with the panel controls but preventing the user from controlling the operation of the electronic device with the remote control. The remote mode of operation allows the transmission of only selected remote control signals, whereby permitting the user to control the operation of the electronic device with the remote control but preventing the user from controlling the operation of the electronic device with the panel controls.

Figure 2:
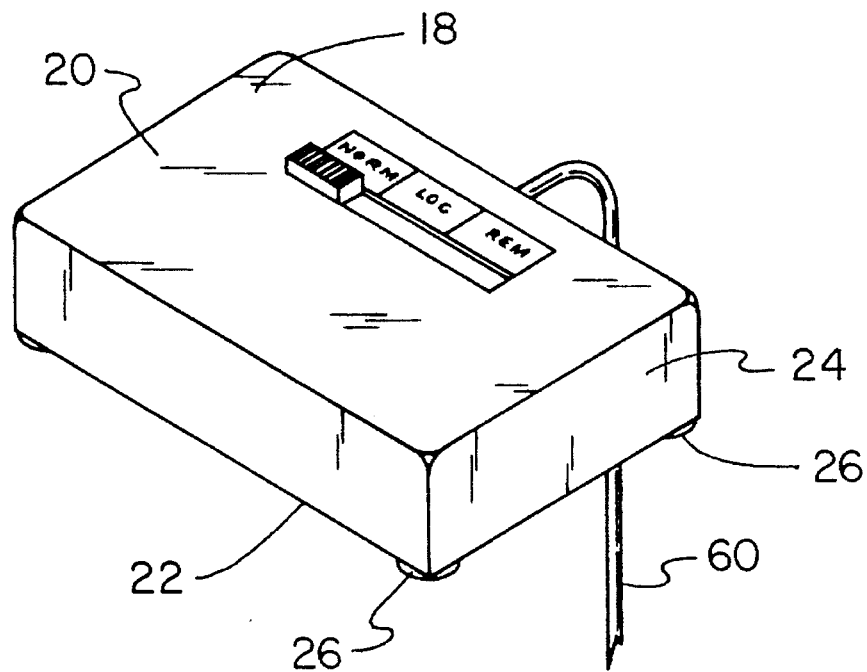
FIG. 2 is an enlarged perspective view of the present invention depicted in FIG. 1.

The fourth major component is the transmission means 60 of FIG. 2. The transmission means is adapted to be coupled between the electronic device 12 and the switch 30. The transmission means delivers internal panel control signals 42 and internal remote control signals 44 from the video/audio electronic device 12 to the switch. The transmission means then supplies selected remote control signals 50 and selected panel control signals 52 from the switch back to the video/audio electronic device for controlling its operation.

Figure 5:
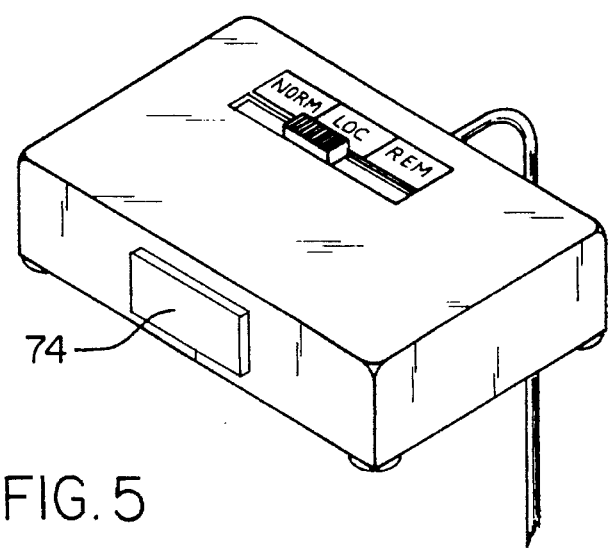
FIG. 5 is a perspective view of an alternate embodiment of the present invention including receiving means for receiving toggling signals for toggling the orientation of the switch.
Figure 6:
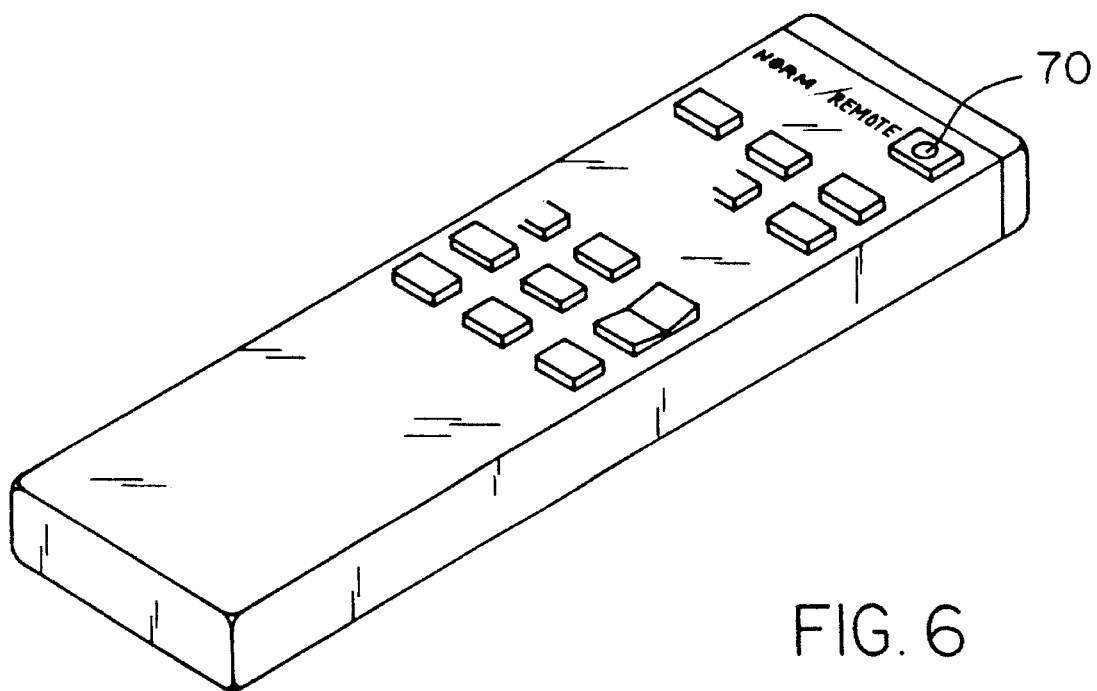
FIG. 6 depicts a remote control unit used with the alternate embodiment of the present invention for generating the toggling signals used for placing the switch in the normal mode or remote mode of operation.

A second embodiment of the present invention is shown in FIGS. 4, 5, and 6. The second embodiment includes substantially all of the components of the present invention further including selection means 70 of FIG. 6. The selection means are coupled to the remote control 16. The selection means have one orientation adapted for allowing a user to select and transmit a first signal. The selection means also have another orientation adapted for allowing a user to select and transmit a second signal.

The second embodiment includes actuating means 72. The actuating means are coupled to the switch 30. The actuating means have one orientation for placing the switch in the remote mode of operation based on the receipt of the first signal. The actuating means have another orientation for placing the switch in the normal mode of operation based on the receipt of the second signal.

Lastly, the second embodiment includes receiver means 74 of FIG. 5. The receiver means are coupled between the selection means 70 and the actuating means 72. The receiver means are used for receiving the first signal and the second signal from the selection means. The receiver means then transmits the first signal and the second signal to the actuating means.

Televisions (TV), Video Cassette Recorders (VCR), and similar electronic devices are used in practically every household in this country and throughout the world. However, these devices as currently constructed do not allow a way for parents to keep their children from playing with the panel control on a TV or VCR. Thus, with the prior art electronic devices, children are able to manipulate the selection of channels, volume, and other accompanying controls without the consent of the parents who may be operating such devices.

The present invention satisfies the need for parents to maintain positive control of the electronic device while in operation by providing a control override switch that disables the panel controls on the electronic device. The present invention thus allows the control functions in the panel of the TV, VCR or any other similar electronic device to be overridden. Panel control of these devices can be transferred to a remote control unit or may be disabled until the override switch is placed in another mode. For electronic devices without remote control units, the controls on the electronic device's control panel are disabled until the override switch is toggled.

When used in operation with TV or VCR devices, the present invention offers three advantages. First, it allows parents to disable the control panel on the front of the TV or VCR and transfer controls to the remote control unit which can easily be kept away from children. This device therefore allows the parents to watch television programs without any interruptions which result from their children manipulating the TV's or VCR's control panel. Second, it protects the controls on an electronic device from the abuse of children, whereby prolonging the life of the control panel switches on the TV or VCR. Third, it helps to prevent accidental erasure of video cassette tapes by children playing with the controls on the VCR. These advantages are not provided by current TVs, VCRs, or any other video/audio electronic devices.

The present invention can be used on many kinds of video/audio electronic devices. It can be used with stereo equipment such as receivers, Compact Disc (CD) players, and the like. It can also be used with computers and numerous other similar automated electronic remote controlled devices.

Specifically, in the normal mode of operation, the switch is placed in the "Normal" position. In this mode, controls on the electronic device and on the remote control unit are enabled. The user may change and channel, volume, etc. from buttons on the electronic device or the remote control unit. This is the way all prior art electronic devices with remote control units are designed to work. The disadvantage of this design is that when an adult is using the electronic device i.e. watching television, he/she can be disturbed by a child playing with the remote control unit or the buttons accessible form the front of the television.

In the local mode of operation, the electronic device is controlled only by the local control panel on the electronic device. This mode is selected when the switch is placed in the "Local" position. The remote control unit is disabled and has no effect on the electronic device. To change channel or volume, the user has to approach the electronic device and use the buttons on its panel. This mode eliminates the possibilities of a child or another person playing with the remote control unit while you are watching TV. The remote control unit is deactivated in this mode, whereby allowing an adult to watch the TV without disturbances when a child is playing with the remote control unit. An example of this situation is when a parent and child are watching TV from a sofa and the remote control unit is in the child's hands. The child can play with the remote control unit but can not change the settings on the TV such as channel, volume, and the like.

In the remote mode of operation, control of the electronic device is enabled only from the remote control unit. The buttons in front of the electronic device are disabled. This mode is selected when the switch is placed in the "Remote" position. The advantage of this mode is that it prevents a child from playing with the controls when an adult is operating the electronic device from a remote location. For example, when a parent is watching TV from a sofa and the child is playing is initially playing in front of the TV then tries to manipulate the control panel on the TV.

There are many possible combinations of the three operating modes. But the normal mode of operation must be available in any combination. This leaves three configurations to choose from:

1. Only Local Mode is available: the local buttons are always working and only the remote control unit may be disabled.
2. Only Remote Mode is available: The buttons on the remote control units are always enabled and the user may select to disable the buttons on the electronic device's panel.
3. Both Local and Remote Modes are available: the user may select to disable either the local or remote control.

The switch may be modified to work with any of the above configurations. With Local Mode Only, the "Remote" mode of operation is removed and vise versa.

The present invention's physical design may have many different appearances. A sliding switch and a push button switch are considered the two most appealing and easy to use. The sliding switch can be slid to one of the three positions to select the operating mode for any electronic device. The push button switch design requires two push buttons-one for local mode of operation and one for remote mode of operation. There must be a light indicator on each button to show which mode is currently selected. The user may select either one or both switches to match the operating mode. At least one button has to be selected.

The present invention can be positioned in a non-obvious place. The best place for the switch is on top of the back of the electronic device. This location allows easy access for an adult but not for children. A toggle switch to place the present invention in the normal mode of operation or the remote mode of operation is integrated into the electronic device's remote control.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and the manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modification and changes will readily occur to those skilled in the art, it is not desired to limit the invention to the exact construction and operation shown and described, and accordingly, all suitable modification and equivalents may be resorted to, falling within the scope of the invention.

What is claimed as being new and desired to be protected by LETTERS PATENT of the United States is as follows:

1. A video/audio electronic device control signal source selection switch for allowing a user to select a source of signals for controlling the operation of a video/audio electronic device having resident panel controls and an accompanying remote control mechanism comprising, in combination:

a hollow box-shaped container having opposed and spaced top and bottom walls with a peripheral side edge disposed therearound;

four suction cup feet, each foot coupled to the bottom wall of the container near a corner thereof and extended downwards therefrom, the feet adapted to be coupled to the outer surface of the video/audio electronic device;

a switch coupled to the container, the switch further comprising:

three orientations for enabling a normal mode of operation, a local mode of operation, and a remote mode of operation thereof;

an input terminal adapted to receive both internal panel control signals that are generated through user interaction with the panel controls and internal remote control signals that are generated through user interaction with the remote control mechanism; and an output terminal for transmitting selected remote control signals and selected panel control signals in a mode of operation based on the orientation thereof, with the normal mode of operation allowing the transmission of both selected remote control signals and selected panel control signals, whereby permitting the user to control the operation of the electronic device using both the remote control and the panel controls, the local mode of operation allowing transmission of only selected panel control signals, whereby permitting the user to control the operation of the electronic device with the panel controls but preventing the user from controlling the operation of the electronic device with the remote control, and the remote mode of operation allowing the transmission of only selected remote control signals, whereby permitting the user to control the operation of the electronic device with the remote control but preventing the user from controlling the operation of the electronic device with the panel controls; and transmission means adapted to be coupled between the electronic device and the switch for delivering the internal remote control signals and the internal panel control signals from the electronic device to the switch and supplying selected remote control signals and selected panel control signals from the switch back to the electronic device for controlling its operation.

2. A video/audio electronic device control signal source selection switch for allowing a user to select a source of signals for controlling the operation of a video/audio electronic device having resident panel controls and an accompanying remote control mechanism comprising, in combination:

a switch further comprising:

three orientations for enabling a normal mode of operation, a local mode of operation, and a remote mode of operation thereof;

an input terminal adapted to receive both internal panel control signals that are generated through user interaction with the panel controls and internal remote control signals that are generated through user interaction with the remote control mechanism; and an output terminal for transmitting selected remote control signals and selected panel control signals in a mode of operation based on the orientation thereof, with the normal mode of operation allowing the transmission of both selected remote control signals and selected panel control signals, whereby permitting the user to control the operation of the electronic device using both the remote control and the panel controls, the local mode of operation allowing transmission of only selected panel control signals, whereby permitting the user to control the operation of the electronic device with the panel controls but preventing the user from controlling the operation of the electronic device with the remote control, and the remote mode of operation allowing the transmission of only selected remote control signals, whereby permitting the user to control the operation of the electronic device with the remote control but preventing the user from controlling the operation of the electronic device with the panel controls; and transmission means adapted to be coupled between the electronic device and the switch for delivering the internal remote control signals and the internal panel control signals from the electronic device to the switch and supplying selected remote control signals and selected panel control signals from the switch back to the electronic device for controlling its operation.

3. The video/audio electronic device control signal source selection switch as set forth in claim 2 further including:

selection means coupled to the remote control and having one orientation adapted for allowing a user to select and transmit a first signal and another orientation adapted for allowing a user to select and transmit a second signal;

actuating means coupled to the switch and having one orientation for placing the switch in the remote mode of operation based on the receipt of the first signal and another orientation for placing the switch in the normal mode of operation based on the receipt of the second signal; and receiver means coupled between the selection means and actuating means for receiving the first signal and the second signal from the selection means and transmitting the first signal and second signal to the actuating means.

4. The video/audio electronic device control signal source selection switch as set forth in claim 2 wherein the video/audio electronic device is a television set.

5. The video/audio electronic device control signal source selection switch as set forth in claim 2 wherein the video/audio electronic device is a video cassette recorder.

6. A video/audio electronic device control signal source selection switch for allowing a user to select a source of signals for controlling the operation of a video/audio electronic device having resident panel controls and an accompanying remote control mechanism comprising:

a switch further comprising:

two orientations for enabling a normal mode of operation and a remote mode of operation thereof;

an input terminal adapted to receive both internal panel control signals that are generated through user interaction with the panel controls and internal remote control signals that are generated through user interaction with the remote control mechanism; and an output terminal for transmitting selected remote control signals and selected panel control signals in a mode of operation based on the orientation thereof, with the normal mode of operation allowing the transmission of both selected remote control signals and selected panel control signals, whereby permitting the user to control the operation of the electronic device using both the remote control and the panel controls and the remote mode of operation allowing the transmission of only selected remote control signals, whereby permitting the user to control the operation of the electronic device with the remote control but preventing the user from controlling the operation of the electronic device with the panel controls; and transmission means adapted to be coupled between the electronic device and the switch for delivering the internal remote control signals and the internal panel control signals from the video/audio electronic device to the switch and supplying selected remote control signals and selected panel control signals from the switch back to the video/audio electronic device for controlling its operation.

* * * * *